US006530736B2

(12) United States Patent
Rosenquist (10) Patent No.: US 6,530,736 B2
(45) Date of Patent: Mar. 11, 2003

(54) SMIF LOAD PORT INTERFACE INCLUDING SMART PORT DOOR

(75) Inventor: Frederick T. Rosenquist, Redwood City, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/905,339

(22) Filed: Jul. 13, 2001

(65) Prior Publication Data

US 2003/0012625 A1 Jan. 16, 2003

(51) Int. Cl.[7] .............................................. B65G 49/07
(52) U.S. Cl. ....................... 414/411; 414/940
(58) Field of Search ............................. 414/217, 217.1, 414/411, 940

(56) References Cited

U.S. PATENT DOCUMENTS

| | | | |
|---|---|---|---|
| 5,834,915 A | * 11/1998 | Babbs et al. ................ 206/565 |
| 5,970,621 A | * 10/1999 | Bazydola et al. ............. 33/533 |
| 6,169,490 B1 | * 1/2000 | Fan ........................ 250/559.12 |
| 6,068,668 A | * 5/2000 | Mastroianni ................ 29/25.01 |
| 6,135,168 A | * 10/2000 | Yang et al. .................. 141/91 |
| 6,188,323 B1 | * 2/2001 | Rosenquist et al. ......... 340/686.5 |
| 6,261,044 B1 | * 7/2001 | Fosnight et al. ............. 414/217 |
| 6,281,516 B1 | * 8/2001 | Bacchi et al. ................ 206/408 |
| 6,318,953 B1 | * 11/2001 | Bonora et al. ............... 414/217 |
| 6,375,403 B1 | * 4/2002 | Mages et al. ............... 414/222.05 |
| 6,382,896 B1 | * 5/2002 | Hu et al. .................... 414/217 |
| 6,413,356 B1 | * 7/2002 | Choshi et al. ............... 414/937 |
| 6,419,438 B1 | * 7/2002 | Rosenquist .................. 414/217 |

FOREIGN PATENT DOCUMENTS

| | | | | |
|---|---|---|---|---|
| EP | 292235 | * 11/1988 | ................. 414/940 |
| EP | 292236 | * 11/1988 | ................. 414/940 |
| JP | 4-215454 | * 8/1992 | ................. 414/940 |
| JP | 11-67863 | * 3/1999 | |
| JP | 2000-133697 | * 5/2000 | |

* cited by examiner

*Primary Examiner*—James W. Keenan
(74) *Attorney, Agent, or Firm*—O'Melveny & Myers LLP (57) ABSTRACT

A SMIF load port assembly is disclosed including a port door position compensation assembly capable of dynamically adjusting a relative spacing between a front surface of a port door and a front surface of a pod door loaded onto the load port assembly so as to compensate for any improper positioning of the front surface of the pod. The position compensation assembly includes a plunger translationally mounted in the port door, and a sensor for detecting a position of the plunger. As a pod is loaded onto the load port assembly is advanced toward the port door, the front surface of the pod door contacts the plunger at which point the position compensation assembly in combination with an overall controller can identify the exact position of the pod door. From this identification, the position of the port and/or pod doors may be adjusted to compensate for any improper positioning of the front surface of the pod door on the load port assembly.

7 Claims, 12 Drawing Sheets

SMIF LOAD PORT INTERFACE INCLUDING SMART PORT DOOR

BACKGROUND OF THE INVENTION

1. Field of the Invention

The present invention relates to a standard mechanical interface (SMIF) load port assembly including a so-called "smart" port door, and in particular to a SMIF load port assembly including a port door position compensation assembly capable of dynamically adjusting a relative spacing between a front surface of a port door and a front surface of a pod loaded onto the load port assembly so as to compensate for any misalignment of the front surface of the pod.

2. Description of Related Art

A SMEF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers and by ensuring that particles from the ambient environment do not enter the immediate wafer environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 0.5 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles become of interest.

A SMIF system has three main components: (1) minimum volume, sealed pods used for storing and transporting wafer cassettes; (2) a minienvironment supplied with ultraclean air flows surrounding cassette load ports and wafer processing areas of processing stations so that the environments inside the pods and minienvironment become miniature clean spaces; and (3) robotic transfer assemblies, such as load ports, to load/unload wafer cassettes and/or wafers from the sealed pods to the processing equipment without contamination of the wafers in the wafer cassette from external environments. The system provides a continuous, ultraclean environment for the wafers as they move through the wafer fab.

SMIF pods are in general comprised of a pod door which mates with a pod shell to provide a sealed environment in which wafers may be stored and transferred. So called "bottom opening" pods are known, where the pod door is horizontally provided at the bottom of the pod, and the wafers are supported in a cassette which is in turn supported on the pod door. It is also known to provide front opening unified pods, or FOUPs, in which the pod door is vertically oriented, and the wafers are supported either in a cassette mounted within the pod shell, or to shelves mounted in the pod shell. Front opening pods include a door having a rear surface which is included as part of the sealed pod environment, and a front surface which is exposed to the environment of the wafer fab.

Figure 1:
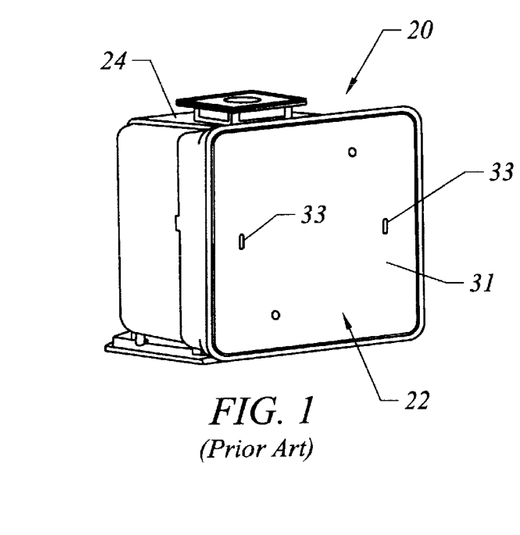
FIG. 1 is a prior art perspective view of a 300 mm front opening SMIF pod.
Figure 2:
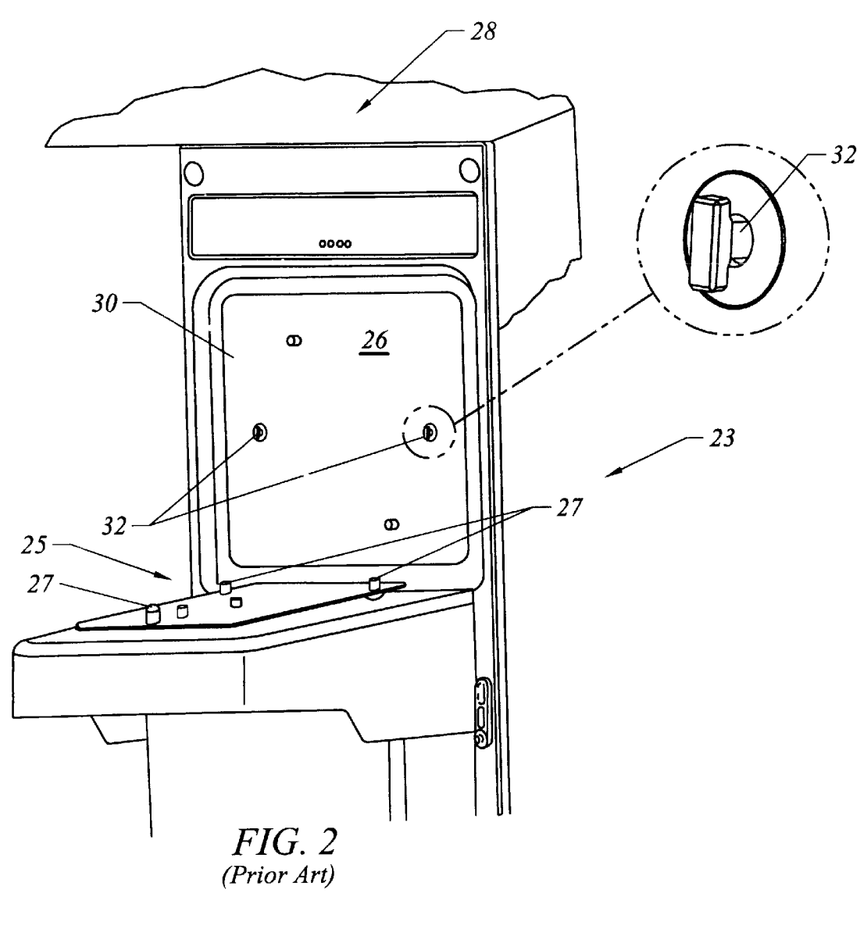
FIG. 2 is a prior art perspective view of a load port assembly including a pair of latch keys capable of fitting into respective slots in the pod door.

FIG. 1 is a prior art perspective view of a 300 mm front opening SMIF pod 20 including a pod door 22 mating with a pod shell 24 to define a sealed environment for one or more workpieces located therein. FIG. 2 is a prior art perspective view of a 300 mm load port assembly 23 for transferring wafers between the pod 20 and a process tool 28 to which the load port assembly 23 is affixed. In order to transfer the workpieces between pod 20 and process tool 28, the pod is manually or automatedly loaded onto a pod advance plate 25 so that a front surface 31 of the pod door faces a front surface 30 of a port door 26 in the load port assembly.

The front surface 30 of the port door 26 includes a pair of latch keys 32 which are received in a corresponding pair of slots 33 of a door latching assembly mounted within pod door 22. An example of a door latch assembly within a pod door adapted to receive and operate with latch keys 32 is disclosed in U.S. Pat. No. 4,995,430 entitled "Sealable Transportable Container Having Improved Latch Mechanism", to Bonora et al., which patent is assigned to the owner of the present invention, and which patent is incorporated by reference herein in its entirety. In order to latch the pod door to the port door, the pod door 22 is seated adjacent the port door 26 so that the vertically oriented latch keys are received within the vertically oriented slots 33.

In addition to decoupling the pod door from the pod shell, rotation of the latch keys 32 also lock the keys into their respective slots 33, thus coupling the pod door to the port door. There are typically two latch key 32 and slot 33 pairs, each of which pairs are structurally and operationally identical to each other.

The pod advance plate 25 typically includes three kinematic pins 27, or some other registration feature, which mate within corresponding slots on the bottom surface of the pod to define a fixed and repeatable position of the bottom surface of the pod on the advance plate and load port assembly.

Figure 3:
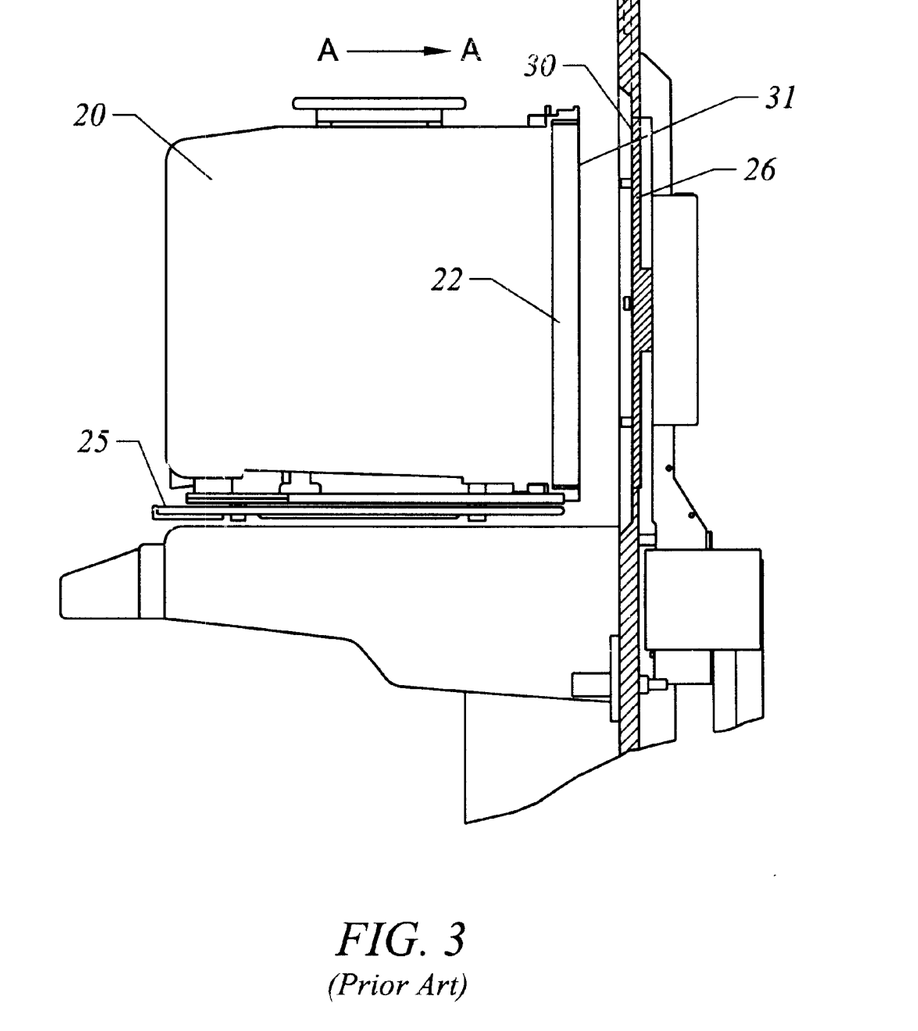
FIG. 3 is a prior art side view of a port door and pod door seated on pod advance plate before the pod door is advanced to port door.

Referring to FIG. 3, the pod advance plate 25 is translationally mounted to advance the pod toward and away from the load port. Once a pod is detected on the pod advance plate by sensors in the load port assembly, the pod is advanced toward the load port in the direction of arrow A—A until the front surface 31 of the pod door 22 lies in contact with the front surface 30 of the port door 26. It is desirable to bring the front surfaces of the respective doors into contact with each other to trap particulates and to ensure a tight fit of the port door latch key in the pod door key slot. However, some process tool manufacturers require that a small space be provided between the port plate surrounding the port door and the pod shell flange at the front edge of the pod shell after the pod has advanced. This space prevents any possible contact between the port plate and the front surface of the pod due to a misaligned front pod surface as explained below.

Once the pod and port doors are coupled, horizontal and vertical linear drives within the load port assembly move the pod and port doors together toward the process tool, and then away from the load port so that wafers may thereafter be transferred between the interior of the pod 20 and interior of process tool 28.

Regardless of the desired relative positions of the pod and port doors after pod advance, it is necessary to precisely and repeatably control this relative positioning to ensure proper transfer of the pod door onto the port door and to prevent particulate generation. hI order to establish the desired relative positions, conventional load port assembly systems rely on the fact that the kinematic pins establish a fixed and known position of the pod on the load port assembly so that, once seated on the kinematic pins, the pod may simply be advanced toward the load port a fixed amount to place the front surfaces of the respective doors in the desired relative positions.

However, it is a drawback to conventional front opening load port assemblies that the system aligns the bottom surface of the pod to the load port assembly by the kinematic pins, but registers off of the front surface of the pod in establishing the proper positioning of the pod door to the port door. The problem is that the actual position of the front surface of a pod seated on a load port assembly may vary as much as approximately 1 mm in front of or behind the expected position. The sources of this variance include warping and tolerances of the pod and/or pod door, the tolerances in the location of the kinematic pins and the tolerances in the location of the port door in the load port.

If the front surface of the pod door is farther from the port door than expected, then the port door latch key may not properly seat in the pod door key slot upon pod advance. This can result in damage to the pod door cover by the latch keys, can create particulates and can cause pod door opening failure resulting in production stoppage and delays. If the front surface of the pod door is closer to the port door than expected, then contact between portions of the pod and the load port upon pod advance may generate particulates.

SUMMARY OF THE INVENTION

It is therefore an advantage of the present invention to allow contact or close proximity of the front surfaces of the pod and port doors.

It is another advantage of the present invention to provide precision control of the spacing between the port and pod doors.

It is a further advantage of the present invention to compensate for any variation between the expected and actual positions of the pod door prior to coupling of the pod door to the port door.

It is a further advantage of the present invention to reduce the risk of damage to the pod door resulting from incorrect seating of the port door keys in the pod door slots.

It is a still further advantage of the present invention to reduce the risk of particulate generation resulting from unintended contact between portions of the pod and the load port assembly upon pod advance to the port.

It is another advantage of the present invention to minimize production downtime resulting from incorrect seating of port door keys in pod door slots.

It is a further advantage of the present invention to allow the pod door to be returned to its correct position with respect to the pod shell after wafer processing within the processing tool.

These and other advantages are provided by the present invention which in general relates to a SMIF load port assembly including a port door position compensation assembly capable of dynamically adjusting a relative spacing between a front surface of a port door and a front surface of a pod door loaded onto the load port assembly so as to compensate for any improper positioning of the front surface of the pod.

In one embodiment of the invention, the door position compensation assembly includes a plunger having a back end mounted within the port door and a front end protruding past a front surface of the port door. The plunger is translationally mounted so as to be able to retract into the port door upon a force exerted on the front end of the plunger. The position compensation assembly further includes a sensor capable of sensing movement of the plunger. In one embodiment, this sensor may comprise a resistor sensing circuit including a potentiometer having a resistance variation actuator to which the back end of the plunger is affixed. After a pod has been loaded onto the pod advance plate of the load port assembly, and is advancing toward the port door, a front surface of the pod door will contact the front end of the plunger to move the plunger rearward at least partially into the port door. Rearward movement of the plunger actuates the resistance variation actuator to thereby change the resistance of the potentiometer, and consequently the voltage across the variable resistance sensing circuit.

The overall system controller uses the electrical change (either voltage, resistance or current) in the sensing circuit of the position compensation assembly to provide a closed loop servo control and positioning of the port door with respect to the pod door while the pod door is advancing toward the port door, or after the pod door has reached its fully advanced position. The controller for the system stores the relationship between the electrical change through the sensing circuit and position change of the plunger. The controller also stores the value of, for example, the voltage across the circuit when the front surfaces of the pod and port doors are in contact with each other. Using this stored relationship and stored value, the position compensation assembly and the controller employ a closed loop servo positioning and control system to determine the final resting positions of the port and/or pod doors.

In one embodiment, after the pod advance plate has moved the pod to its fully advanced position, the controller samples the voltage across the resistor sensing circuit, determines the difference between the sampled voltage and the desired final voltage, and adjusts the position of the port door through closed loop servo control until the final desired voltage is obtained. The controller and position compensation assembly may further determine and adjust the final positions of the port and/or pod doors to obtain contact between the pod and port doors according to other control algorithms.

In a further embodiment of the present invention, sensors as described above may also be provided in the port plate surrounding the port door to sense the position of the pod shell. It is desirable that the pod shell be close to but not in contact with the port plate. The sensors in the port plate can detect the position of the pod shell relative to the port plate, and then use this information to adjust the position of the pod. To the extent this adjustment changes the position of the pod door relative to the port door, the position of the port door may be adjusted to ensure proper positioning therebetween.

BRIEF DESCRIPTION OF THE DRAWINGS

The present invention will now be described with reference to the drawings in which.

DETAILED DESCRIPTION

The present invention will now be described with reference to FIGS. 4–11 which in preferred embodiments relate in general to a system for adjusting a position of a port door in a load port assembly after a pod has been loaded thereon. Adjustment of the port door in the load port assembly allows the system to dynamically compensate for any improper positioning of the front surface of the pod door and/or pod shell on the load port assembly. While a preferred embodiment of the present invention operates in conjunction with a SMIF pod, it is understood that the present invention may operate with any of various front opening containers. Additionally, the present invention may operate with containers carrying any of various workpieces, including semiconductor wafers, reticles, and flat panel displays. The structure according to the present invention complies with and allows compliance with all applicable SEMI standards.

Figure 4:
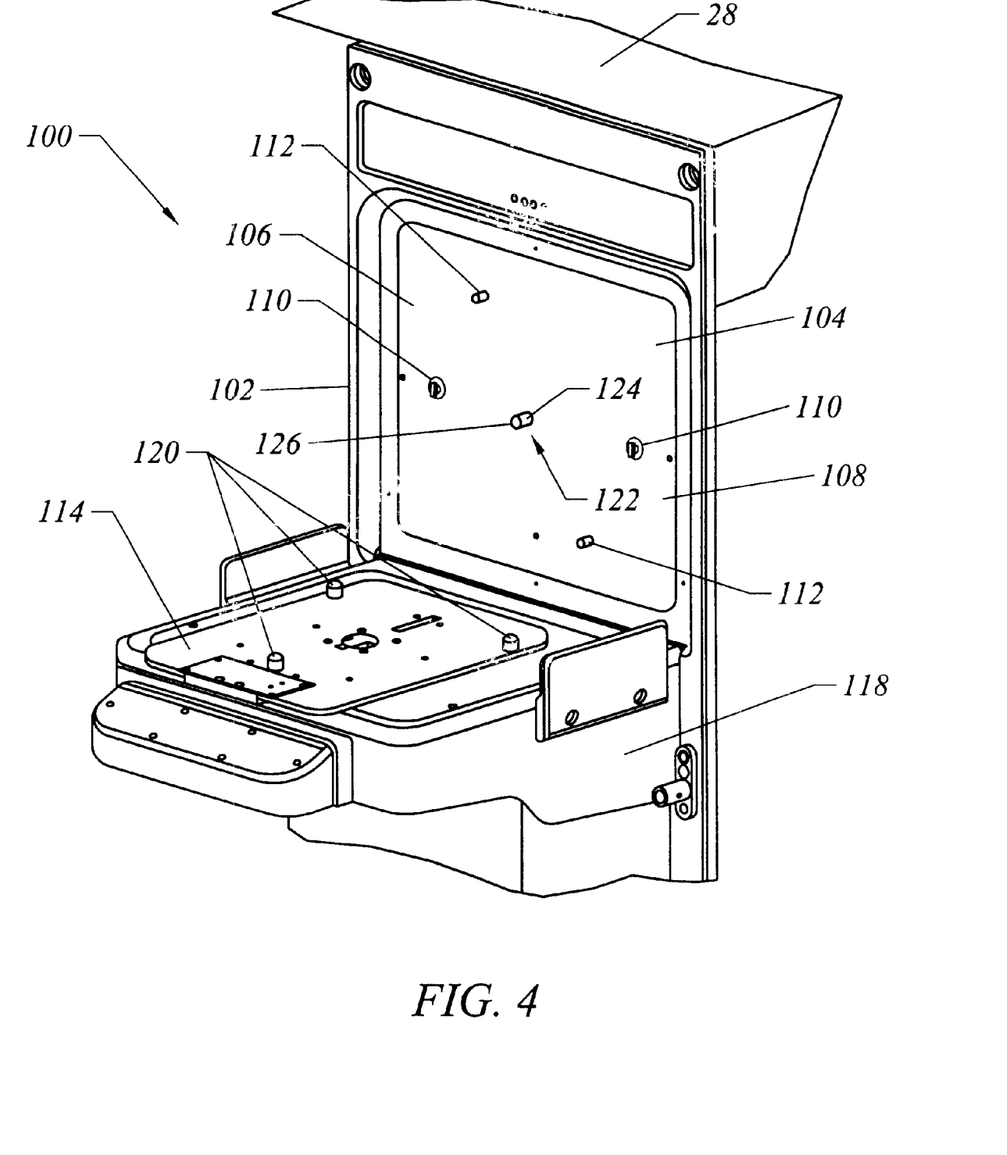
FIG. 4 is a perspective view of a load port assembly according to the present invention showing a portion of the position compensation assembly.

Referring now to FIG. 4, there is shown a perspective view of 300 mm load port assembly 100 for transferring workpieces between a 300 mm front opening SMIF pod 20 and a process tool 28. The pod 20 and tool 28 are of known construction, for example as described in the Background of the Invention section. Load port assembly 100 includes a port plate 102 having a central opening 106 defining a load port through which workpieces may be transferred between the pod and process tool. A port door 104 fits within and seals the load port 106 in the absence of a pod at the assembly 100. Port door 104 includes a front surface 108 having a pair of latch keys 110 which are received in a corresponding pair of slots 33 in pod 20 as described in the Background of the Invention. As previously explained, the latch keys 110 serve to both decouple the pod door 22 from the pod shell 24 and to couple the pod and port doors together. Although not shown, a motor is provided within port door 104 for actuating latch keys 110. Port door 104 may further include registration pins 112 for mating within corresponding holes on the front surface 31 of the pod door.

Load port assembly 100 further includes a pod advance plate 114 translationally mounted via a linear drive (not shown) to a horizontal base 118 of the load port assembly 100. As explained in the Background of the Invention section, the pod advance plate advances the pod toward the port door once the pod is loaded onto the plate. Pod advance plate 114 preferably includes kinematic pins 120, or some other registration feature which mate within corresponding slots on the bottom surface of the pod 20 to define a fixed and repeatable position of the bottom surface of the pod 20 on the pod advance plate 114 and load port assembly 100. A pod at port sensor (not shown) is further provided for sensing when a SMIF pod 20 is loaded onto the pod advance plate 114.

Load port assembly I100 further includes a controller (not shown) such as a computer or programmable logic controller for operating linear drive 116 upon receipt of the appropriate signal from the pod at port sensor. The controller further operates the motor within the port door for activating latch keys 110 once the pod 20 has been advanced to its loading position.

Figure 5:
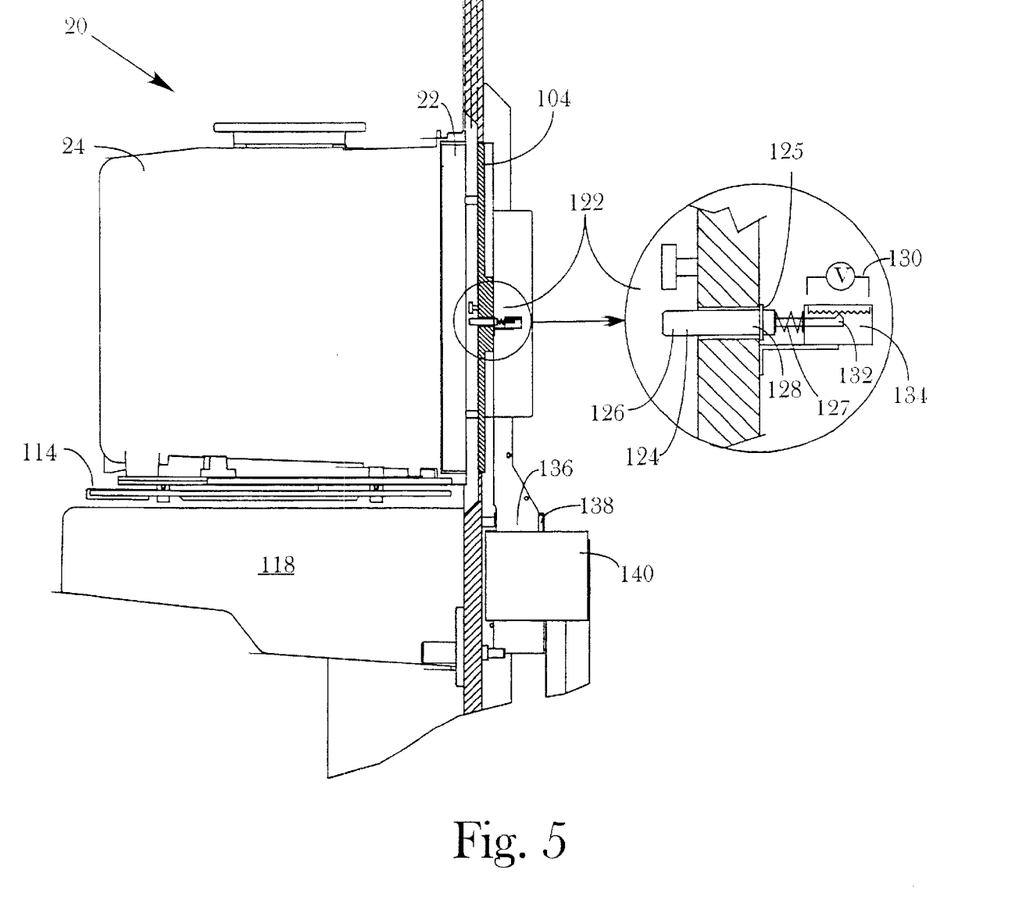
FIG. 5 is a cut away side view showing the position compensation assembly within the port door of a load port assembly according to the present invention.

Referring now to FIGS. 4 and 5, in accordance with the principles of the present invention, load port assembly 100 further includes a position compensation assembly 122 for indicating a necessary adjustment of the port door position while in the load port so as to adjust for any improper positioning of the front surface of the pod door 22 on the load port assembly. Position compensation assembly 122 includes a plunger 124 having a back end 128 mounted within the port door 104 and a front end 126 extending out of port door 104. While one such plunger 124 is shown in FIG. 4, it is contemplated that port door 104 include more than one plunger 124 as explained in greater detail hereinafter. Plunger 124 is preferably translationally mounted in port door 104 by a bushing 125 affixed through an opening formed through the port door 104. As the pod advance plate 114 advances the pod 20 toward the port door 104, the front surface 31 of pod door 22 contacts front end 126 of plunger 124 to move the plunger 124 rearward, i.e., further into the port door 104. The plunger 124 is biased as by a spring 127 into its extended position so that in the absence of a force on a front end 126 of plunger 124, the plunger 124 occupies its fully extended position protruding past the front surface 108 of port door 104.

In a preferred embodiment, the front end of plunger 124 may extend approximately ⅛ inch when no force is exerted on front end 126. It is understood that this amount may vary in alternative embodiments. Once the front surface of the pod door 22 contacts the front end of plunger 124, the spring 127 maintains the front end 126 of the plunger 124 in contact with the pod door 22, and the spacing between the pod and port doors will be given by the distance plunger 124 extends beyond the front surface 108 of the port door 104.

Referring now to FIGS. 4 and 5, the back end 128 of plunger 124 is affixed to a sensor such as variable resistance sensing circuit 130 which, together with plunger 124 and the controller, provide closed loop servo sensing of the actual spacing between the front surface 108 of the port door 104 and the front surface 31 of the pod door 22 as explained in greater detail below. Variable resistance sensing circuit 130 includes a potentiometer 134 of conventional design having a resistance variation actuator 132 to which the back end 128 of plunger 124 is affixed. Upon contact between the front surface 31 of the pod door 22 and the front end 126 of the plunger 124, the plunger 124 actuates the resistance variation actuator 132 to thereby change the resistance of variable resistor 134. This change in resistance in turn alters the voltage through the variable resistance sensing circuit 130. The controller uses this change in voltage to provide closed loop servo control and positioning of the port door 104 with respect to the pod door 22 as will be explained hereinafter. In alternative embodiments, it is understood that the plunger 124 may actuate a rotary potentiometer via a rack gear affixed to the rear of plunger 124 and a spur gear affixed to the rotary potentiometer.

As shown in FIG. 5, the port door 104 is affixed at its back surface (i.e., the surface facing the interior of the load port assembly) to a door removal and return mechanism 136 of conventional design. Once the pod 20 and port doors are coupled together, mechanism 136 withdraws the doors from the load port to provide a path for workpiece transfer. In particular, mechanism 136 includes a horizontal drive 138 for moving the pod 20 and port doors rearward out of load port 106 once the doors are coupled together, and a vertical drive 140 for moving the coupled pod and port doors down away from the load port to allow workpiece transfer therethrough between pod 20 and process tool 28. Those of skill in the art would appreciate that the coupled pod and port doors may be removed from the port by other known mechanical schemes. In addition to removing the coupled pod and port doors from the load port, in accordance with the principles of the present invention, horizontal drive 138 also adjusts the position of the port door 104 within the load port prior to coupling with the pod door 22 as indicated by the position compensation assembly and the controller. This function of the horizontal drive 138 is explained in greater detail below.

The operation of the present invention will now be described with reference to FIGS. 4–7B. Initially, a SMIF pod is loaded either manually or automatedly onto the pod advance plate 114. Sensors in the load port detect the presence of the pod 22 on the plate 114 and send a signal to the tool controller and/or fab host to activate the advance plate linear drive 116 to advance the pod 20 toward the port. In conventional systems, the final spacing between the pod 20 and port doors has been established by advancing the pod advance plate 114 a fixed distance based on the known home position of the front surface of the port door 104 in the load port and the expected position of the front surface 31 of the pod door 22. However, in accordance with the present invention, the final resting positions of the port and/or pod doors are dynamically determined by a closed loop servo positioning system including the position compensation assembly and the controller. In general, as the pod door 22 is advanced toward the port door 104 on the pod advance plate 114, the front surface 31 of the pod door 22 contacts the plunger 124 at which point the position compensation assembly 22 in combination with the controller can identify the exact position of the pod door 22 with respect to the load port assembly. From this identification, the position of the port and/or pod doors maybe adjusted to compensate for any improper positioning or warping of the front surface 21 of the pod door 22 on the load port assembly.

The position compensation assembly 122 and controller may control door spacing according to various control algorithms. In a first embodiment, the pod advance plate 114 advances to a fully advanced position toward the load port as in the prior art. At some point during the pod advance, the pod door 22 contacts the plunger 124 and forces the plunger 124 further into the port door 104. As the plunger 124 moves rearward, the resistance and voltage through resistor sensing circuit 130 affixed to the back end 128 of the plunger 124 change. The precise relationship between the electrical change and the change in position of the plunger 124 is stored in the controller memory. For example, in one embodiment, the controller stores the linear relationship that the voltage through the resistor sensing circuit changes 1 volt for every 20 mil change in plunger 124 position. It is understood that this relationship may vary in alternative embodiments. The controller also stores the voltage through the sensing circuit corresponding to the position of the plunger 124 when the front surfaces of the port and pod doors are at their desired spacing. It is understood that instead of voltage, the controller may alternatively map resistance, current change or other electrical properties against plunger 124 position in alternative embodiments.

After the pod advance plate 114 comes to rest at its fully advanced position, the controller samples the voltage through the resistor sensing circuit 130. The port door 104 may be moved forward (i.e., out away from the port plate) or moved rearward (i.e., toward the processing tool), depending on whether the measured voltage is above or below the desired voltage. Adjustment of the port door 104 position is accomplished by the horizontal drive 138. It is further understood that the position of the port door 104 may be adjusted while the pod advance plate 114 and pod door 22 are advancing.

EXAMPLE 1

Figure 6A:
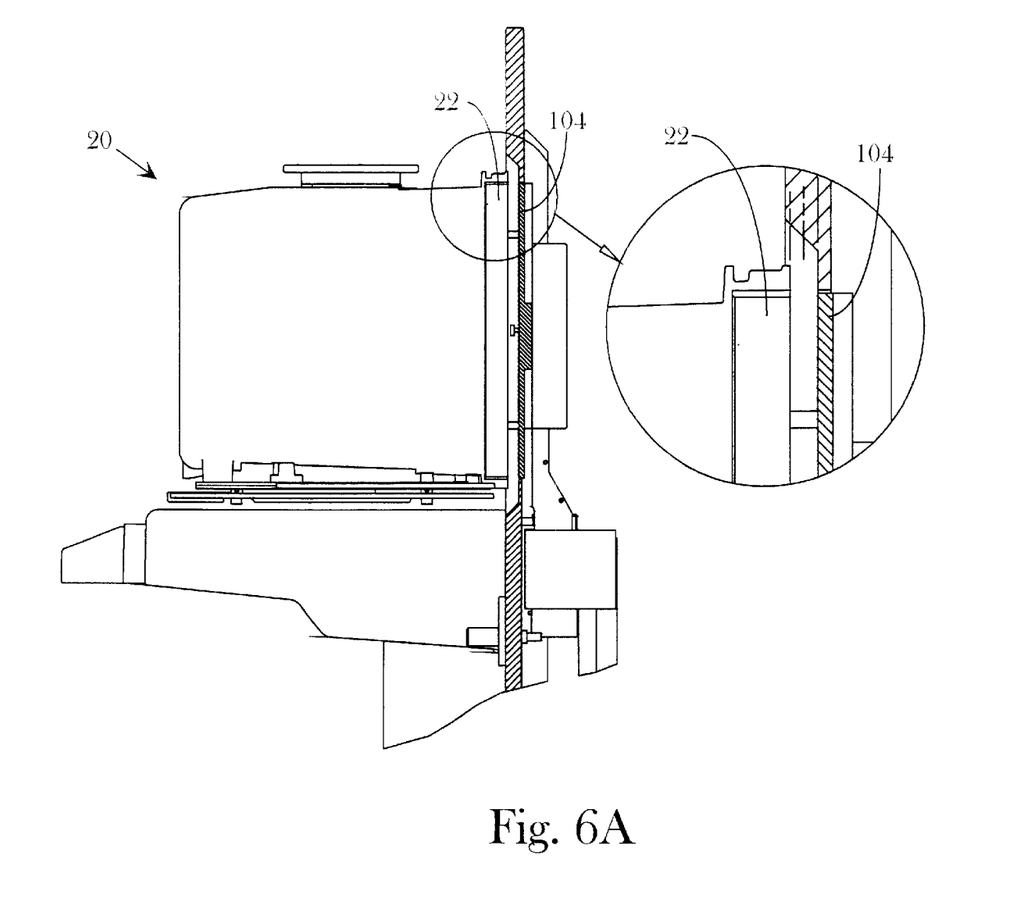
FIG. 6A is a side view of a port door shown in its home position with a space between the port door and the advanced pod door.
Figure 6B:
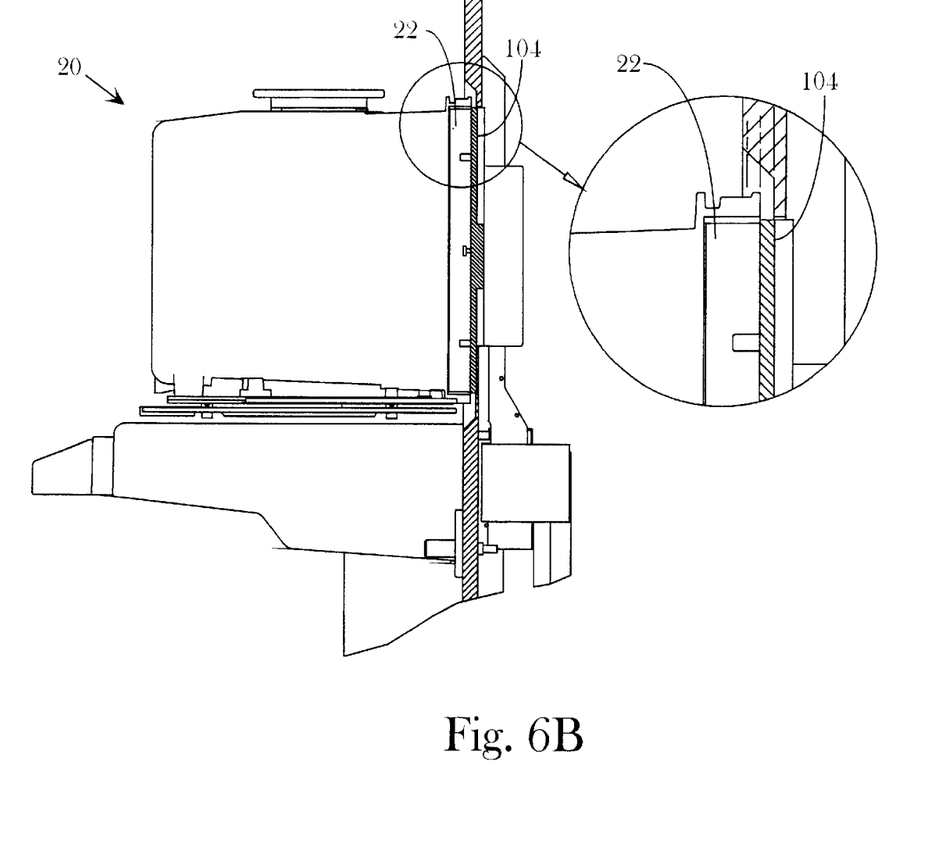
FIG. 6B is a side view of the port door of FIG. 6A in its compensation position extending out of the load port toward the pod door.

As a first example with reference to FIGS. 6A and 6B, it is desired that the pod door 22 be flush against the port door 104 after the pod door 22 is fully advanced. In this example, a flush position of the pod and port doors results in a voltage across the circuit 130 of 1 volt (the circuit may be calibrated to have a variety of voltages when the doors are in the flush position). With the particular pod of this example, owing to tolerances of the pod, kinematic pins and/or port door, or warping of the pod, the spacing between the port and pod doors upon full advancement of the pod advance plate 114 is larger than expected as shown in FIG. 6A, and results in a voltage of 2.5 volts through circuit 130. Thus, the controller determines that the position of the port door 104 must be adjusted toward the pod door 22 an amount which results in a 1.5 volt decrease through circuit 130. (In this embodiment, the potentiometer 134 is positioned with respect to the plunger 124 so that the voltage through the circuit 130 decreases as the doors get closer and the plunger 124 is forced further into the port door. It is understood that the position of the potentiometer 134 with respect to the plunger 124 may be reversed so that the voltage through the circuit 130 increases as the doors get closer together). Assuming the above relationship of a 1 volt change for every 20 mil plunger 124 position change, the controller determines that the port door 104 needs to be advanced 30 mils toward the pod door 22 as shown in FIG. 6B to achieve the final desired spacing between the front surfaces of the port and pod doors.

As the position of the port door 104 is adjusted to compensate for the improper positioning of the front surface of the pod door 22, the spacing between the pod and port doors may be continuously monitored by monitoring the voltage through the circuit 130 to thus provide precision closed loop servo control of the final spacing between the doors. Once the desired spacing is achieved, the pod door 22 and pod shell are decoupled, and the pod door 22 and port door 104 are coupled, as described above.

EXAMPLE 2

Figure 7A:
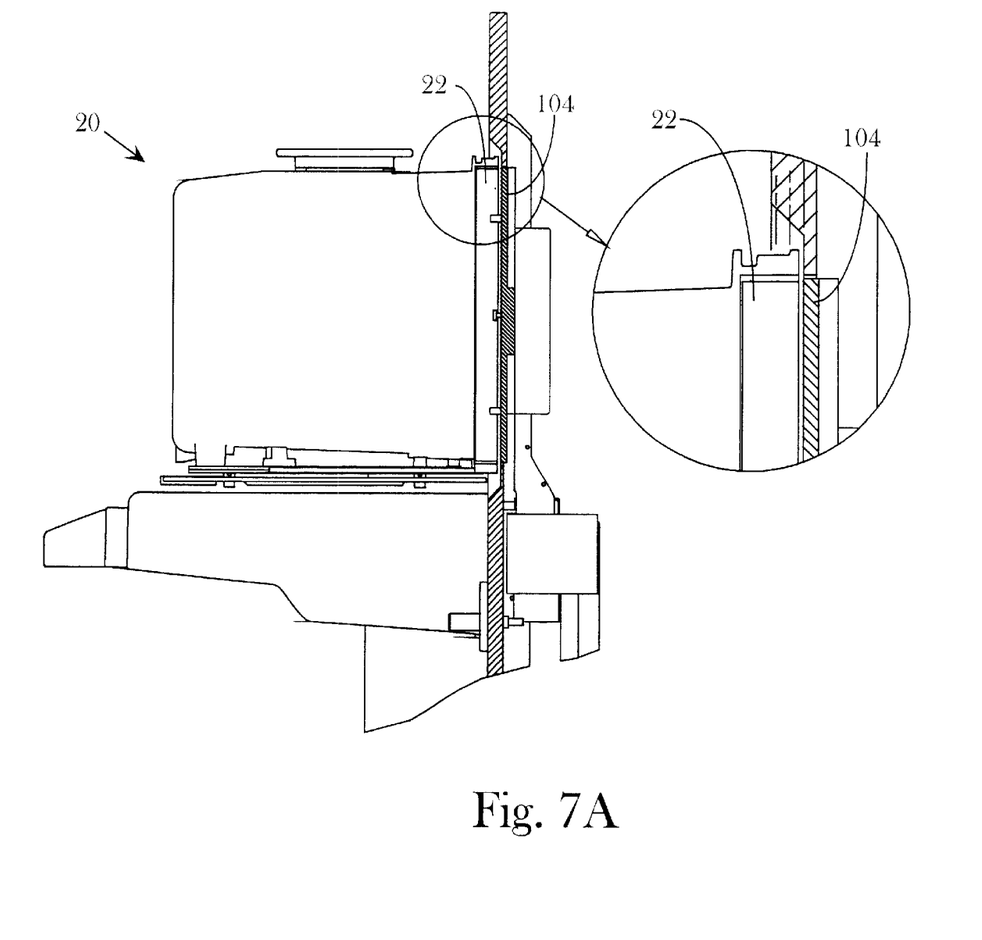
FIG. 7A is a side view of a port door shown in its home position with a pod advancing toward the port door.
Figure 7B:
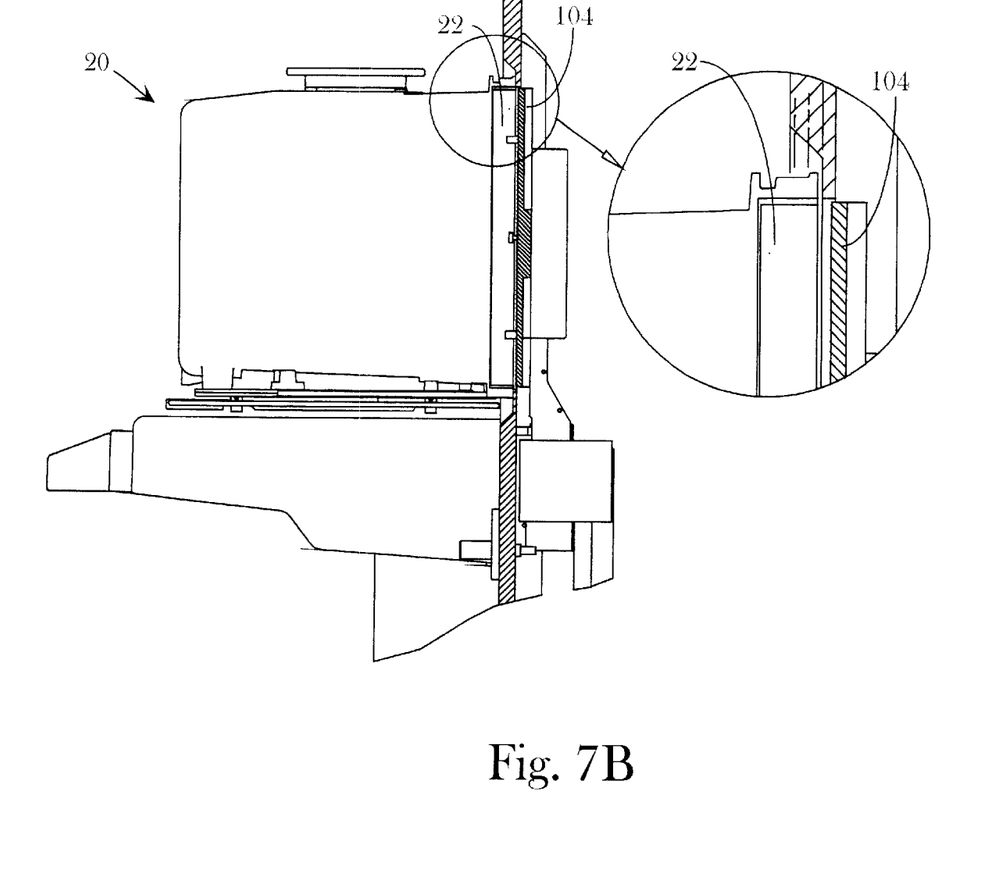
FIG. 7B is a side view of the port door of FIG. 7A in its compensation position extending into the load port away from the pod door.

A further example will now be described with reference to FIGS. 7A and 7B. In this example, it is desired that the final spacing between the front surfaces of the pod and port doors is 20 mils, which, in this example, results in a voltage across the resistor sensing circuit of 2 volts. With the pod of this particular example, the spacing between the port and pod doors upon full advancement of the pod advance plate 114 is smaller than expected, as shown in FIG. 7A, and results in a voltage of 1.25 volts across circuit 130. Thus, the controller determines that the position of the port door 104 must be adjusted away from the pod door 22 an amount which results in a 0.75 volt increase through circuit 130. Assuming again the relationship of a 1 volt change for every 20 mil plunger position change, then the controller knows that the port door 104 needs to be retracted into the load port by 15 mils as shown in FIG. 7B to achieve the final desired spacing between the front surfaces of the port and pod doors. Again, a closed loop servo control may be provided to precisely control the final spacing between the doors.

It is understood that the above progress is by way of example only and is in no way limiting on the present invention. The final desired spacing, the voltage through the circuit corresponding to the final desired spacing and the relationship between voltage change and plunger position may all vary in alternative embodiments.

In a second embodiment of the control algorithm according to the present invention, the pod advance plate 114 may advance the pod 20 until the front surface 31 of the pod door 104 contacts the front end 126 of the plunger 124. In a fully extended position, the plunger 124 extends a known distance past the front surface 108 of the port door 104. Thus, upon the initial contact between the plunger 124 and pod door, and rearward movement of the plunger, the precise distance of the front surface 31 of the pod door 22 from the front surface 108 of the port door 104 is known. Similarly, the remaining distance that the pod and/or port doors must advance toward each other to bring the doors to their final desired juxtaposed resting positions is known.

In a preferred embodiment, the pod advance plate 114 continues to advance the pod 20 until it reaches its fully advanced position. After the pod 20 comes to rest, the port door 104 may be moved forward (i.e., out away from the port plate) or moved rearward (i.e., toward the process tool), depending on how much the pod 20 advanced after initial contact with the plunger 124, to achieve the final desired spacing between the doors. Adjustment of the port door 104 is accomplished by the horizontal drive 138. Again, it is understood that the position of the port door 104 maybe adjusted while the pod door 22 is advancing.

As in the above described controller algorithm, the amount by which the pod 20 is advanced after initial contact can be determined by the change in voltage through the resistance sensing circuit 130 and a known relationship between a voltage change and plunger position change. As would be appreciated by those of skill in the art, the amount by which the pod 20 is advanced after initial contact can be determined by other known mechanisms and schemes, such as for example an encoder on the linear drive 116 which advances the pod advance plate 114.

EXAMPLE 3

An example of the operation of the present invention according to this alternative control algorithm will be explained with reference again to FIGS. 6A and 6B. In one embodiment of the present invention, the plunger 124 may extend 100 mils past the front surface of the port door 104 in its fully extended position, and it is desired that the final position of the pod door 22 be flush against the port door 104. With the pod of this example, after initial contact of the front surface of the pod door 22 with the front end of the plunger 124, the pod advance plate 114 advances another 80 mils to its fully advanced position. Therefore, in this example, the controller identifies that the spacing between the pod and port doors after pod advance is 20 mils. As such, the controller advances the port door 104 an additional 20 mils toward the pod door 22 as shown in FIG. 6B to achieve the final desired spacing between the port and pod doors. As the position of the port door 104 is adjusted to compensate for any deviation of the front surface of the pod door 22 from the expected position, the spacing between the pod and port doors may be continuously monitored by monitoring the voltage across the circuit 130 to thus provide precision closed loop servo control of the final door spacing.

The distance the pod advance plate 114 travels from initial plunger 124 contact to its fully advanced position may be tracked by monitoring the change in voltage through the resistor sensing circuit 130 between those two positions. Other known tracking devices and schemes may be used in alternative embodiments, such as for example providing an encoder on the linear drive 116 for the pod advance plate 114 which is capable of precisely indicating a change in the pod advance plate 114 position over time.

EXAMPLE 4

As another example with reference again to FIGS. 7A and 7B, the plunger 124 extends 125 mils past the front surface of the port door 104, and the final desired spacing between the front surfaces of the port and pod doors is 25 mils. With the pod of this example, after initial contact of the front surface of the pod door 22 with the front end of the plunger 124, the pod advance plate 114 advances another 110 mils to its fully advanced position. The spacing after pod advancement in this example is therefore 15 mils. In order to achieve the final desired spacing of 25 mils, the controller retracts the port door 104 10 mils toward the process tool. Again, closed loop servo control may be provided to precisely control the final spacing between the doors.

It is understood that the above progress is by way of example only and is in no way limiting on the present invention. The distance of the plunger 124 in front of the port door 104, the final desired spacing, and the amount the pod advance plate 114 advances may all vary in alternative embodiments.

As explained in the above examples, in a preferred embodiment, the position of the port door 104 is corrected after the pod door 22 is fully advanced on the pod advance plate 114 and at rest. However, it is possible that the actual position of the pod door 22 is such that it will contact the port door 104 when fully advanced. For example, the pod contacts a plunger 124 extending 125 mils past the surface when the pod advance plate 114 is still 140 mils away from its fully advanced position. In this instance, in a preferred embodiment, the controller preferably moves the port door 104 rearward prior to the port door 104 coming to rest so as to prevent contact between portions of the pod door 22 and the port door 104.

Moreover, in an alternative embodiment, after contact of the front surface of the pod door 22 with the plunger 124, it is contemplated that the port door 104 may be driven rearward or forward as necessary while the pod advance plate 114 is advancing the pod toward the port door 104. In such an embodiment, after contact of the pod door 22 with the plunger 124, the closed loop servo control provided by the position compensation assembly and controller can continuously monitor and adjust the position of the port door 104 based on the voltage through the circuit 130 as the spacing between the doors decreases until the doors come to rest at the desired relative position with respect to each other.

In a further alternative embodiment, after initial contact of the pod door 22 with the plunger 124, instead of the pod advance plate 114 advancing to its fully advanced position and then adjusting the position of the port door 104, the controller may instead adjust the advance of the pod advance plate 114 via the linear drive 116 so that the pod advance plate 114 comes to rest with the front surfaces of the pod and port doors at the desired final spacing. In such an embodiment, there is no need to adjust the position of the port door 104.

In a further alternative embodiment, it is understood that, after contact of the pod door 22 with the plunger 124, the controller may control and adjust both the advance of the pod advance plate 114 and the position of the port door 104 in combination with each other to achieve the final desired spacing between the port and pod doors. In this alternative embodiment, the position of the port door 104 may be adjusted during or after the advance of the pod door 22 to the position dictated by the controller.

In most applications, the final desired position of the pod door 22 would be flush against the port door 104. This position allows a low pressure region to be established between the pod and port doors to further facilitate the coupling of the doors and trapping of particles between the doors. In such embodiments where a low pressure region between the doors is necessary for a proper interface, the present invention can be instrumental in ensuring proper contact between the doors.

In embodiments where contact between the doors is desired, if the pod door 22 is located forward of the expected position so that contact between the pod and port doors occurs before the pod is fully advanced, the system according to the present invention may handle this either of two ways. In a first embodiment, the pod door 22 may be moved rearward as explained above to compensate for the forward position of the pod door 22. In a second embodiment, the advance plate 114 may simply cease advancing upon the desired contact of the doors.

The pod shell may also play a role in the positioning of the pod and port doors. In a fully advanced position, the pod shell is preferably close to (approximately 1 mm) but not in contact with the port pate 102 surrounding the port. Thus, in the example above where the pod door 22 contacts the port door 104 before the pod is fully extended, the pod shell may be too far from the port plate 102. Thus, the port door 104 may be moved into the load port so that when the pod is fully advanced, the pod door 22 lies in contact with the port door 104 and the pod shell is properly positioned with respect to the port plate 104.

Figure 8:
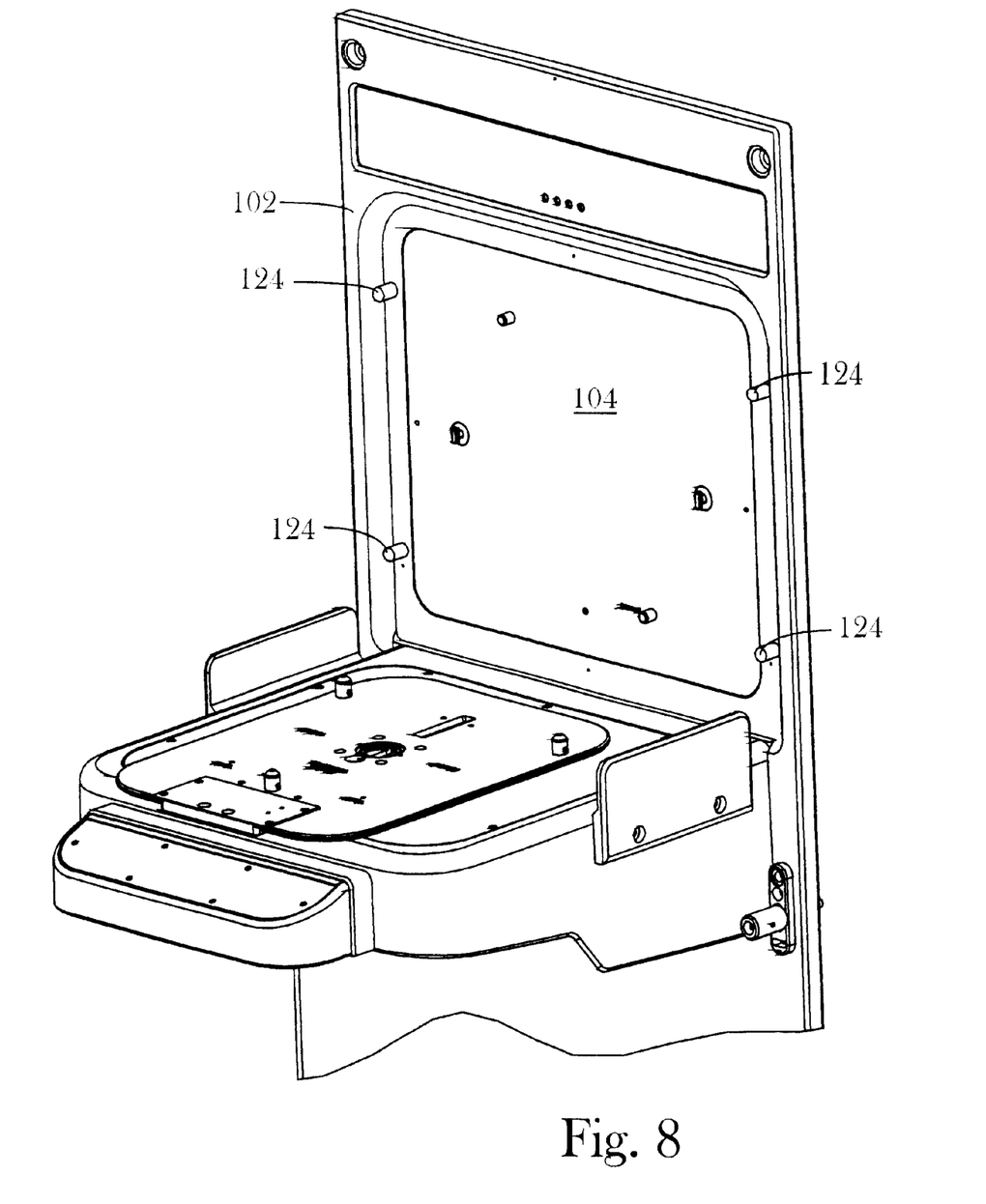
FIG. 8 is a perspective view similar to FIG. 4 but including an alternative configuration of the position compensation assembly according to the present invention.

It is understood that the same principles may be utilized to sense and control the spacing between the port plate 102 and pod shell 24 as the pod shell approaches the port plate. In such an embodiment, as shown in FIG. 8, one or more plungers 124 may extend from the port plate 152 so as to engage the outer rim of the pod shell as the pod advances toward the load port on the pod advance plate. In the event the pod door 22 is in contact with the port door 104, but the port plate plunger detects that the pod shell is too far from the port plate, the port and pod doors can move rearward as described above until the proper spacing between the pod shell and port plate is established. Moreover, if the port plate plunger detects that unintended contact is about to occur between the pod shell and port plate upon continued advancement of the pod toward the load port, the controller can stop the pod advance so that the potentially harmful contact between the portions of the pod shell and port plate can be avoided.

It is a further advantage of the present invention that the position compensation assembly allows the pod door 22 to be returned to its correct position within the pod shell. In conventional systems not including the position compensation assembly according to the present invention, when a front surface of a pod door 22 deviates slightly from the expected position, if the port door 104 key is able to properly mate with the pod door 22 slot to support the pod door 22 on the port door 104, then the original position of the pod door 22 in the pod shell is lost. As such, in conventional systems, upon return of the pod door 22 to the pod shell, the pod latching mechanisms may not be able to properly reacquire the pod door 22.

This problem is solved by the present invention in that, by controllably adjusting the position of the port door 104 and/or pod door 22 to compensate for the actual position of the front surface of the pod door 22, the original position of the pod door 22 in the pod shell is not lost. As such, after workpiece processing and upon return of the pod door 22 to the SMIF pod, the port door 104 is able to return the pod door 22 to the precise position at which the pod door 22 was acquired.

Up to this point, the actual position of the front surface of the pod door 22 has been detected mechanically by the plunger 124 upon contact of the front surface of the pod door 22 with the front end of the plunger 124. However, it is understood that in alternative embodiments, the plunger 124 may be replaced by other sensors that may be used to detect the actual position of the pod door 22 once the pod door 22 is loaded on the pod advance plate 114 and/or as the pod advances so that any improper positioning of the front surface of the pod door 22 maybe dynamically compensated for. Such alternative sensors include but are not limited to sonar and retroreflective sensors, and various other proximity sensors.

Moreover, up to this point, a resistor sensing circuit 130 has been described as the sensor for indicating the distance by which the plunger 124 protrudes past the front surface of the port door 104. However, as would be appreciated by those of skill in the art, other sensors are contemplated for use instead of circuit 130. For example, a linear encoder, a linear transducer or an inductor may be mounted in the port door 104 for measuring the distance the plunger 124 protrudes past the front surface, and forwarding that information to the controller. It is understood that the distinct functions served by the plunger 124 and sensing circuit 130 may be accomplished by a single sensor of known construction in alternative embodiments.

Figure 9:
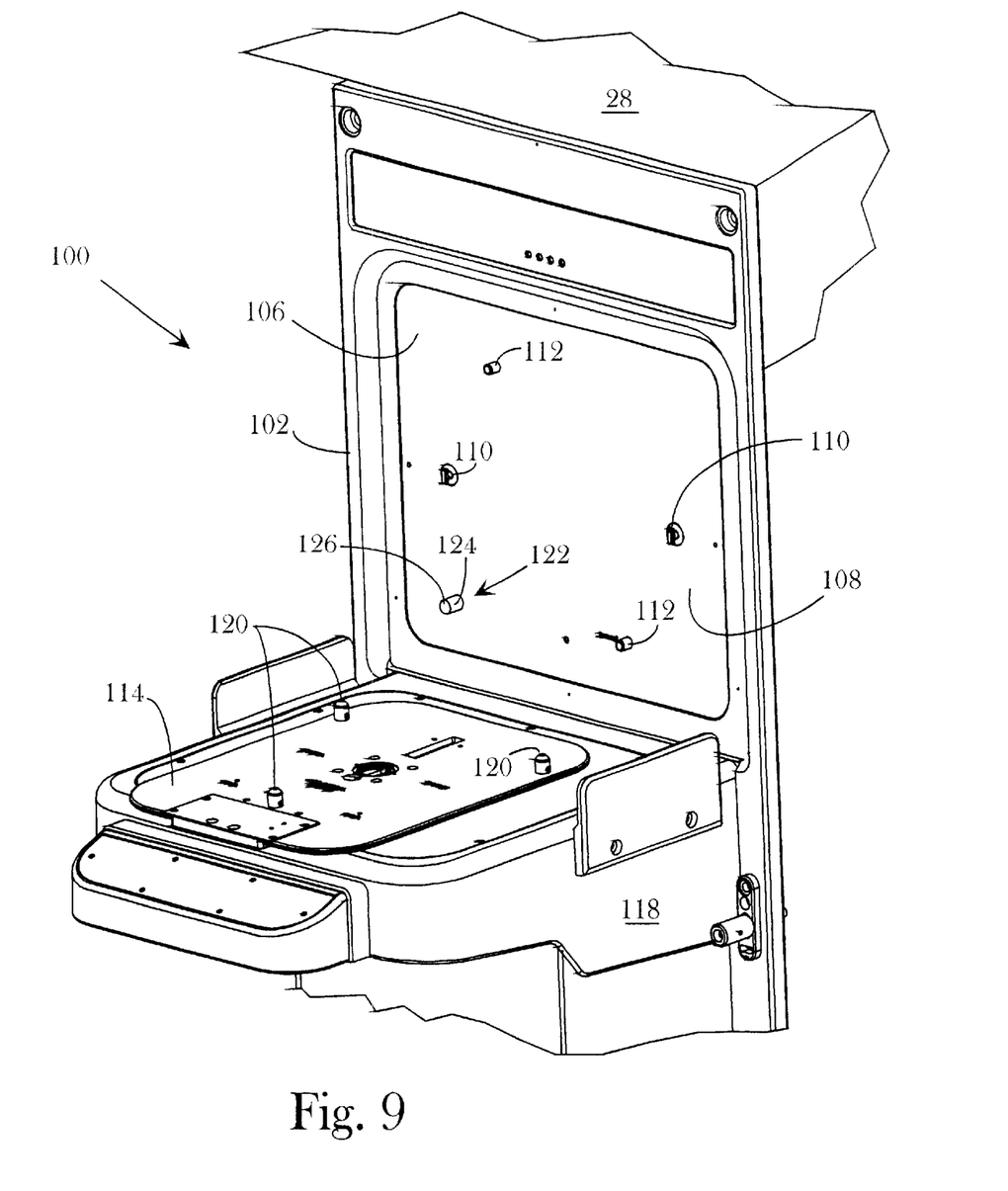
FIG. 9 is a perspective view similar to FIG. 4 but including a further alternative configuration of the position compensation assembly according to the present invention.
Figure 10:
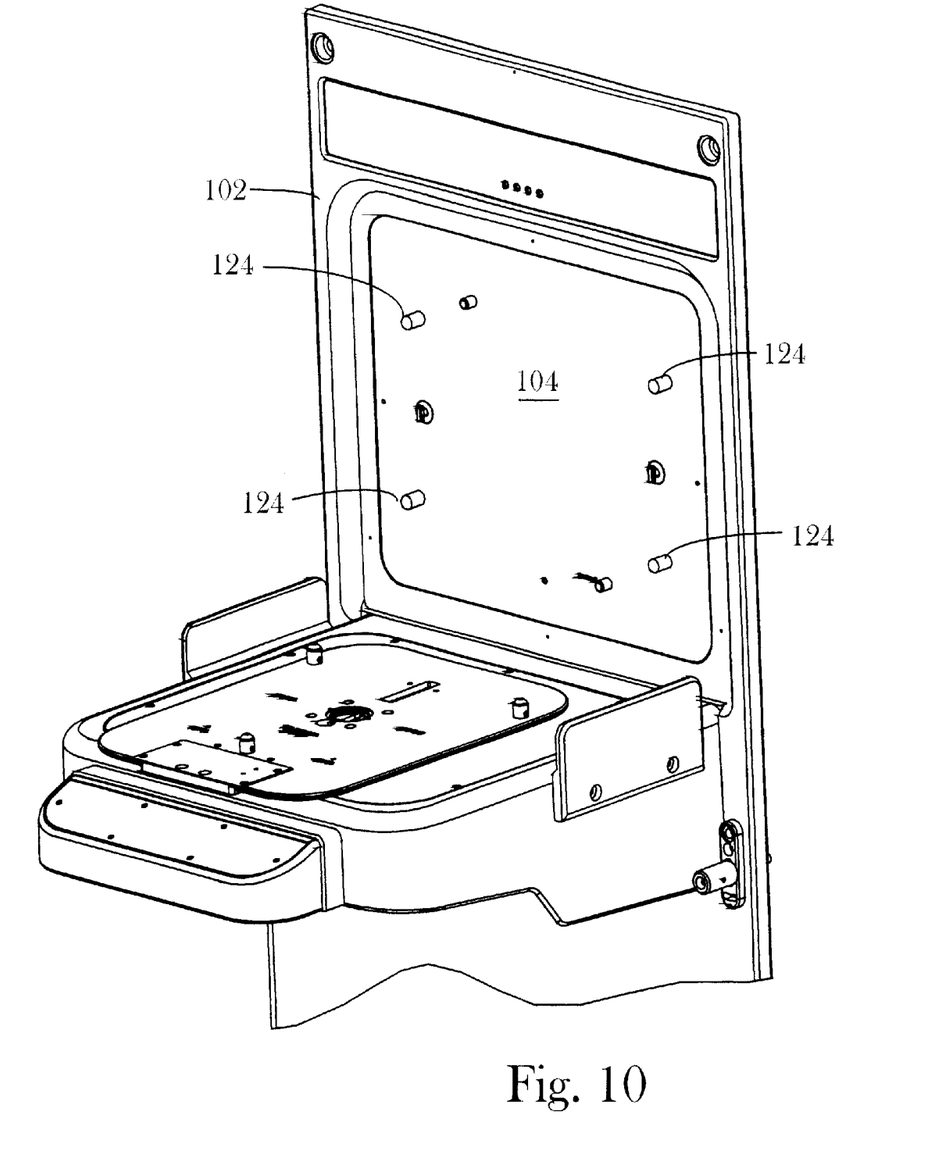
FIG. 10 is a perspective view similar to FIG. 4 but including a further alternative configuration of the position compensation assembly according to the present invention.

As shown in FIG. 4, the preferred embodiment of the present invention may include a single plunger 124 centrally located on port door 104 for detecting the actual position of a front surface of a pod door 22. However, it is understood that in alternative embodiments of the present invention, the position compensation assembly may comprise a single plunger 124 eccentrically mounted through port door 104, as shown in FIG. 9. The position compensation assembly may alternatively include a plurality of plungers spaced around and protruding past the front surface of the port door 104 such as shown in FIG. 10. It is understood that various other configurations and various other numbers of plungers are contemplated.

The multiple plungers described with reference to FIG. 10 may be particularly useful in a further alternative embodiment shown in FIG. 11. Up to this point, the position compensation assembly corrects the position of the port door 104 in a single direction, i.e., perpendicular to its surface, without changing the planar orientation of the port door. However, it is possible that the actual position of the plane of the front surface of the pod door 22 may not be parallel to the plane of the port door 104. It is therefore contemplated in an alternative embodiment shown in FIG. 11 that both the relative spacing and planarity of the port door to the pod door may be adjusted. In this way, in addition to controlling the spacing between the doors, the position compensation assembly ensures that the doors come to rest in parallel planes.

Figure 11:
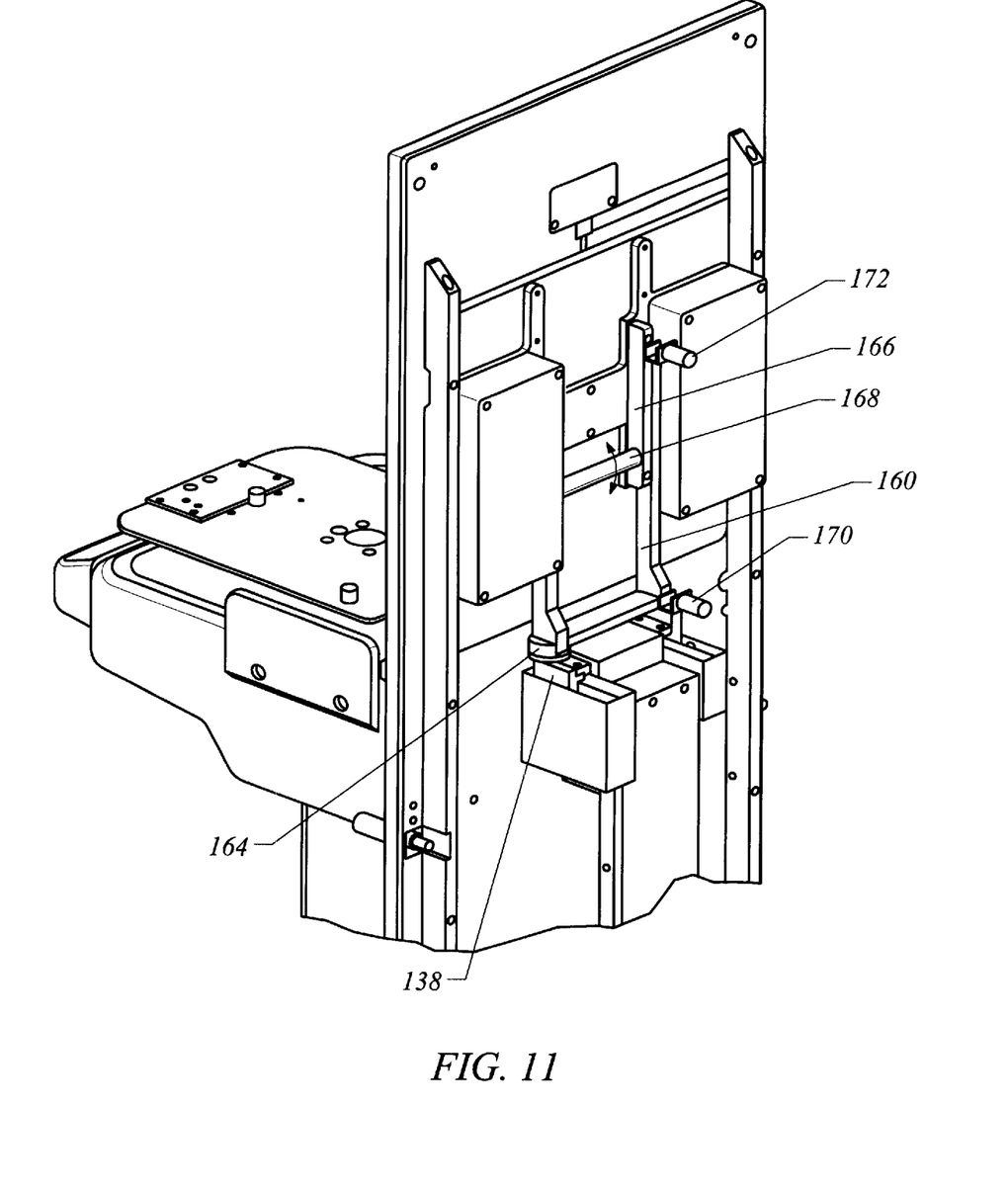
FIG. 11 is an alternative embodiment of the present invention where planarity of a port door can be adjusted in addition to moving forward and back.

While various configurations are possible for accomplishing planarity adjustment, in FIG. 11, a pair of vertical supports 160 are affixed to the horizontal drive 138 via a first pivotal mount 164 which allows pivoting of the vertical supports about a vertical axis through the pivotal mount 164. The port door 104 is in turn affixed to brackets 166 (one such bracket shown) which are in turn pivotally affixed to the vertical supports via a second pivotal mount 168. The second pivotal mount 168 allows pivoting of the port door 104 about a horizontal axis through the pivotal mount 168. In this alternative embodiment, a first axial adjustment drive 170 may be affixed to horizontal drive 138, and is capable of pivoting the port door 104 about the vertical axis through the first pivotal mount 164. The port door 104 may further include a second axial adjustment drive 172 affixed to one of the vertical supports, which drive 172 is capable of pivoting the port door 104 about the horizontal axis through the second pivotal mount 168. The drives 170 and 172 are in turn affixed to the controller via electrical connections (not shown). Thus, upon an indication by the plurality of plungers that the plane of front surface of the pod door 22 is not parallel to the plane of the port door 104, the planarity of the port door 104 can be adjusted to that of the pod door 22. This occurs in addition to the spacing adjustment by the horizontal drive as discussed above.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

I claim:

1. A position compensation assembly included on a load port assembly for transferring workpieces through a load port, between a pod loaded onto the load port assembly and a process tool to which the load port assembly is attached, after the pod is advanced toward the port on a pod advance plate, the load port assembly including a port door having a front surface, and the pod including a pod door and a pod shell, the pod door including a front surface facing the front surface of the port door, the position compensation assembly including:

a sensor system for detecting a spacing between the front surface of the port door and the front surface of the pod door after the pod begins to advance toward the port door on the pod advance plate; and means for adjusting a position of at least one of the port door and pod door based on said spacing detected by said sensor system.

2. A position compensation assembly as recited in claim 1, wherein said sensor system dynamically detects said spacing as the pod is advanced toward the port door.

3. A position compensation assembly included on a load port assembly for transferring workpieces through a load port, between a pod loaded onto the load port assembly and a process tool to which the load port assembly is attached, after the pod is advanced toward the port on a pod advance plate, the load port assembly including a port door having a front surface, and the pod including a pod door and a pod shell, the pod door including a front surface facing the front surface of the port door, the position compensation assembly including:

a sensor system for detecting a spacing between the front surface of the port door and the front surface of the pod door after the pod begins to advance toward the port door on the pod advance plate; and a controller for adjusting a position of at least one of the port door and pod door based on said spacing detected by said sensor system.

4. A position compensation assembly as recited in claim 3, wherein said sensor system dynamically detects said spacing as the pod is advanced toward the port door.

5. A position compensation assembly included on a load port assembly for transferring workpieces through a load port, between a pod loaded onto the load port assembly and a process tool to which the load port assembly is attached, after the pod is advanced toward the port on a pod advance plate, the load port assembly including a port door having a front surface, and the pod including a pod door and a pod shell, the pod door including a front surface facing the front surface of the port door, the position compensation assembly including:

a plunger having a first portion mounted in the port door and a second portion capable of protruding past the front surface of the port door, the plunger capable of translation in a direction perpendicular to the front surface of the port door upon contact between said second portion of said plunger and the front surface of the pod door;

a sensor for sensing a position of said plunger with respect to the port door; and a controller for adjusting a position of at least one of the port door and pod door based on said position of said plunger detected by said sensor.

6. A position compensation assembly as recited in claim 5, wherein said sensor comprises a resistance sensing circuit.

7. A position compensation assembly as recited in claim 6, wherein said resistance sensing circuit comprises a potentiometer including a resistance variation actuator moving with said plunger.

* * * * *